United States Patent
Lee

(10) Patent No.: US 6,862,244 B2
(45) Date of Patent: Mar. 1, 2005

(54) DRAM WITH SEGMENTAL CELL ARRAYS AND METHOD OF ACCESSING SAME

(75) Inventor: Jae-Goo Lee, Young-in (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 344 days.

(21) Appl. No.: 10/146,694

(22) Filed: May 15, 2002

(65) Prior Publication Data

US 2003/0112694 A1 Jun. 19, 2003

(30) Foreign Application Priority Data

Dec. 17, 2001 (KR) ........................................ 2001-80225

(51) Int. Cl.$^7$ ................................................. G11C 8/00
(52) U.S. Cl. .................. 365/230.03; 365/203; 365/196; 365/204; 365/230.05
(58) Field of Search ............................ 365/230.03, 203, 365/196, 204, 230.06

(56) References Cited

U.S. PATENT DOCUMENTS

| | | | | |
|---|---|---|---|---|
| 4,969,125 A | * | 11/1990 | Ciraula et al. ............... | 365/203 |
| 5,619,464 A | * | 4/1997 | Tran ........................... | 365/203 |
| 5,825,710 A | | 10/1998 | Jeng et al. | |
| 5,940,342 A | * | 8/1999 | Yamazaki et al. ..... | 365/230.03 |
| 6,084,806 A | * | 7/2000 | Sugibayashi ................ | 365/200 |

OTHER PUBLICATIONS

Yasuharu Sato. et al. "Fast Cycle RAM (FCRAM): a 10–ns Random Row Access, Pipe–lined Operating DRAM," 1998 Symposium on VLSI Circuits Digest of Technical Papers. pp. 22–25.

* cited by examiner

Primary Examiner—Connie C. Yoha
(74) Attorney, Agent, or Firm—F. Chau & Associates, LLC

(57) ABSTRACT

In a semiconductor memory device having a plurality of memory cells grouped in memory banks, each memory bank having a plurality of memory blocks accessible by a common row address, a method of reading from or writing to the plurality of memory blocks, comprising the steps of detecting successive read or write operations of different blocks, prefetching the address of the next block to be read or written during the first of the successive read or write operations; and withholding a precharge of the memory bank having the successively read or written memory blocks after the first of the successive read or write operations until completion of the successive read or write operations. A semiconductor memory device is also provided having a circuit for inhibiting the activation of the precharge signal at the end of a first memory access operation when successive memory access operations are to be performed with the first memory access operation at a first row address and a first memory block and the next memory access operation at the same first row address and a second memory block having a block address different from the first memory block.

27 Claims, 11 Drawing Sheets

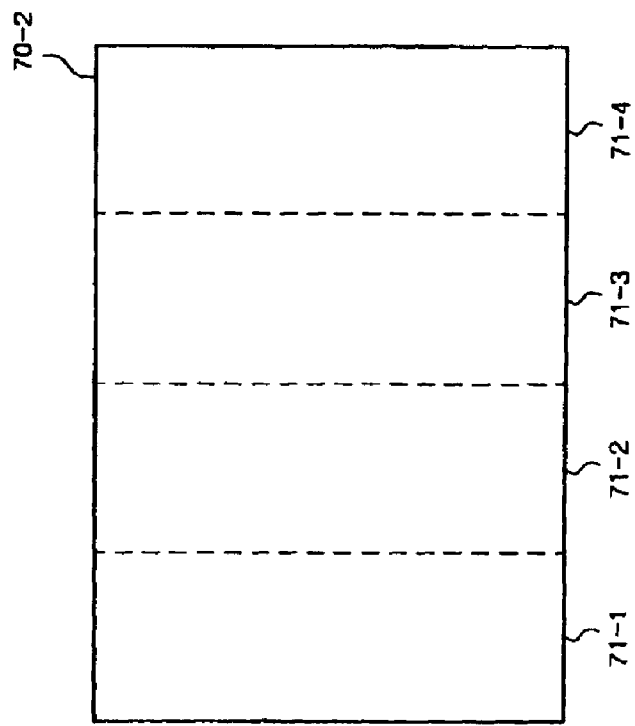
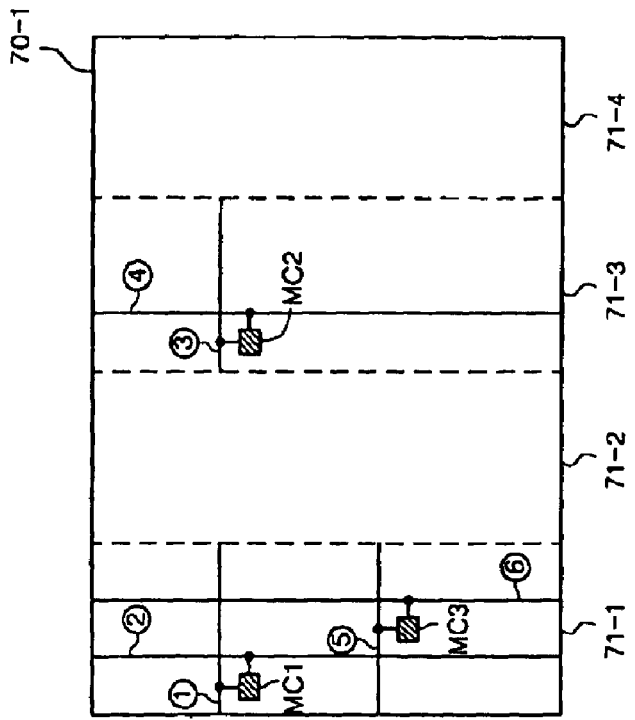
FIG. 9

FIG. 11
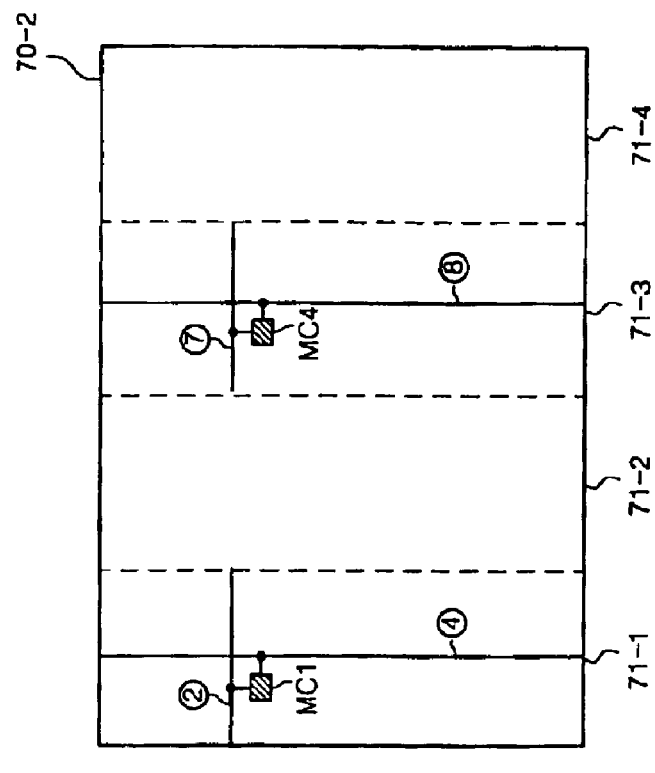
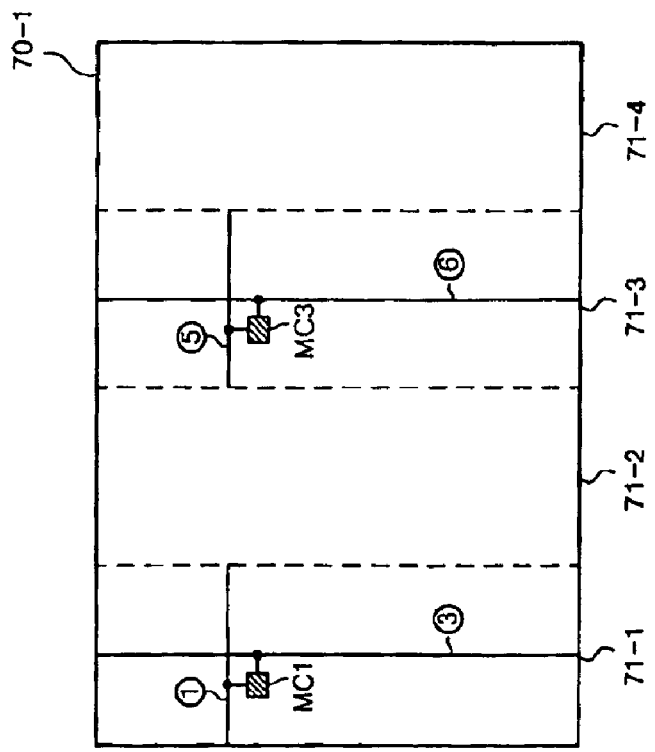

DRAM WITH SEGMENTAL CELL ARRAYS AND METHOD OF ACCESSING SAME

BACKGROUND OF THE INVENTION

1. Technical Field

The present invention is directed to a semiconductor memory device; in particular, a DRAM having a segmental cell array.

2. Discussion of the Related Art

Generally, a DRAM read/write operation involves three commands—an active command to select a row address and a word line, an RD/WR command (a read command or a write command) to select a bit line and a column address, and a precharge command to complete read/write operation and prepare a next read/write operation.

To achieve high-speed data transfer rate, the recent trend in the DRAM industry has focused on improvements in interface performance, and generally not on any changes in the DRAM core. As a result, the memory access time tRC has not greatly improved, and effective bandwidth falls steeply when the row address changes frequently. The practice of dividing a memory array into multiple banks (multi-bank approach) may improve the performance somewhat, but the problem of address transition within the same bank can cause fatal performance degradation.

A fast cycle random access memory (FCRAM) has been proposed for reducing tRC time. In a FCRAM, a memory cell array is segmented into a plurality of smaller blocks and each block is activated independently. In the segmented block, the number of cells connected to one word line could be reduced so that the activation time of a selected word in the block could be reduced.

FIG. 1 is a plan view illustrating a pin configuration of a conventional fast cycle dynamic semiconductor memory device. The fast cycle dynamic semiconductor memory device of FIG. 1 includes a power voltage pin VCC, a ground pin GND, address pins A1 to A12, block address pins A13 and A14, a bank address pin B0, data I/O pins DQ1 to DQ8, and command pins CMD. The command pins CMD are to apply a clock signal CLK, an inverted chip selecting signal CSB, and a signal FN.

When a read/write command is applied to the command pin CMD, the semiconductor memory device of FIG. 1 receives a row address via the address pins A1 to A12, a bank address via the bank address pin B0, and a block address signal via the block address pins A13 and A14.

When a lower address latch command signal is applied to the command pin CMD, the semiconductor memory device of FIG. 1 receives a column address signal via the address pins A1 to A10, an auto pre-charge control signal via the address pin A12, and a bank address signal via the bank address pin B0.

FIG. 2 is a block diagram of a conventional fast cycle dynamic semiconductor memory device. The conventional fast cycle dynamic semiconductor memory device includes two memory cell array banks 30-1 and 30-2, each including four memory cell array blocks 31-1 to 31-4, a command buffer 32, a command decoder 34, a bank address buffer 36, a row address buffer 38, a pre-charge control signal generating circuit 40, a block address buffer 42, a block selecting signal generating circuit 44, a column address buffer 46, row decoders 48-1 and 48-2, and column decoders 50-1 and 50-2.

The bank select circuit 36 buffers the bank address B0 in response to the ACTIVE command and RD/WR command to generate bank select signals BA and BB. The bank select circuit 36 selects the bank to be activated during row address buffer time in response to the active command and selects the bank for read/write operations during column address buffering in response to the RD/WR command.

The row-address buffer 38 buffers the addresses A1 to A12 in response to the ACTIVE command. The row decoders 48-1 and 48-2 decode the buffered row address outputted from the row address buffer 38 to generate the word line selecting signals WL1 to WLm in response to the bank selecting signals BA and BB outputted from the bank address buffer 36, respectively.

The block address buffer 42 buffers the block addresses A13 and A14 in response to the ACTIVE command. The block selecting signal generating circuit 44 decodes the buffered block address outputted from the block address buffer 42 to generate the block selecting signals BK1 to BK4 in response to the ACTIVE command. Therefore, a Row or word line in a block cell array is activated by ACTIVE command along with bank address signal of pin B0, row address signal A1~A12 of pin A1~A12 and block address signal of pin A13~A14. The column-address buffer 46 buffers the addresses A1 to A10 in response to the READ command. The column decoders 50-1 and 50-2 decode the column address to generate column selecting signals Y1 to Yn in response to the bank selecting signals BA and BB outputted from the bank address buffer 36, respectively.

The pre-charge control signal generating circuit 40 generates the auto precharge control signals PREA and PREB to perform a precharge operation of the memory cell array bank 30-1 and the memory cell array bank 30-2, respectively in response to the auto precharge command. The auto precharge command is issued at the same time with the READ command by bringing A12 to a logic "high." Once the auto precharge command is given, no new commands are possible to that particular bank during the auto precharge operation. Thus, even if a memory access of data located at the same row address but a different block address, the precharge command being at high prevents overlapping operations. In other words, assume that two operations are in the same row address but different block addresses, prior to the termination of current operation by the precharge command, the memory controller cannot start a new operation. Therefore, a new active command for the second operation in activating a new block row address is issued only after the first operation is completed. Thus, the advantages of dividing the cell array into a plurality of the block cell arrays is reduced or eliminated.

U.S. Pat. No. 6,108,243 describes in detail the semiconductor memory device of FIG. 2.

FIG. 3 is a timing diagram illustrating a read operation of the semiconductor memory device of FIG. 2 when the memory cells located at the same row address but a different block address are successively accessed to the same memory cell array bank, wherein a burst length is 2, and a column address strobe (CAS) latency is 2.

In FIG. 3, CLK denotes a clock signal, and CMD denotes a command. B0 denotes a bank address. A1 to A11 denote a row address when the active command is applied and a column address when the read command is applied. A12 denotes a row address when the active command is applied and a pre-charge control signal when the read command is applied. DQ denotes a data output signal, and A13 and A14 denote block addresses.

FIG. 4 shows a simplified block diagram version of the memory cell array block according to the timing diagram of FIG. 3.

A successive read operation of the memory cell of the semiconductor memory device of FIG. 2 having the same row address and the different block address is described below with reference to FIGS. 3 and 4.

All of the read command RDA and all of the lower address latch command LAL are inputted at a rising edge of the clock signal CLK. In the first read operation, when the bank address BA, the row address RA1, and the block address BK1 are applied together with a first read command RDA, a word line ① of the memory cell array block 31-1 of the memory cell array bank 30-1 is selected.

When the bank address BA, the column address CA1 and the auto pre-charge control signal A12 having a logic "high" level are applied together with the lower address latch command LAL, a bit line ② of the memory cell array bank 30-1 is selected. Therefore, data is read from the memory cell MC1 between the word line ① and the bit line ②. And, a pre-charge operation of the memory cell array bank 30-1 is performed in response to the auto pre-charge control signal A12 having a logic "high" level.

The succeeding second read operation should be initiated after finishing the precharge operation. When the bank address BA, the row address RA2, and the block address BK3 are applied together with a second read command RDA, a word line ③ of the memory cell array block 31-3 of the memory cell array bank 30-1 is selected.

When the bank address BA, the column address CA1 and the auto pre-charge control signal A12 having a logic "high" level are applied together with the lower address latch command LAL, a bit line ④ of the memory cell array bank 30-1 is selected. Therefore, a data is read from the memory cell MC2 between the word line ③ and the bit line ④. And, a pre-charge operation of the memory cell array bank 30-1 is performed in response to the auto pre-charge control signal A12 having a logic "high" level. Data QA11, QA12, QA21 and QA22 are outputted, in response to each read command RDA to a memory controller (not shown) two at a time in sequence when two cycles pass after the read command RD is applied. The memory controller waits for a given time period ("time gap") to retrieve data QA21 and QA22 of the second read operation after it receives the data QA11 and QA12 of the first read operation.

Accordingly, it is desirous to maintain the advantages of segmenting the cell array into a plurality of the block cell arrays and increase system performance by a gapless operation for successively accessing memory cells having the same row address but different block addresses.

SUMMARY OF THE INVENTION

According to an aspect of the present invention, in a semiconductor memory device having a plurality of memory cells grouped in memory banks, each memory bank having a plurality of memory blocks accessible by a common row address, a method is provided for reading from or writing to the plurality of memory blocks, comprising the steps of; detecting successive read operations of different blocks; prefetching the address of the next block to be read or written during the first of the successive read operations; and; withholding a precharge of the memory bank having the successively read or written memory blocks after the first of the successive read or write operations until completion of the successive read or write operations.

The method further including the step of generating a valid flag upon detecting a successive read or write operation, and withholding a precharge command upon receipt of the valid flag, wherein the valid flag signal is input to the memory device via an address pin, and a next bank signal for signaling the next bank to be read or written is input to the memory device via an address pin.

The method further including the step of prefetching a next bank signal for signaling the next bank to be read or written during the first of the successive read or write operations, and issuing a precharge command when the valid flag is off.

Preferably, the successive read or write operations are completed after the issuance of one active bank command. The method further including the step of interleaving between more than one memory banks, and issuing a precharge command upon completion of the successive read or write operations, and the precharge command is one of an externally issued and a HIDDEN PRECHARGE command.

A semiconductor memory device is also provided comprising a plurality of memory blocks accessible by a common row address and a block row address; a bit line and a sense amplifier corresponding to each memory cell in each memory block, each sense amplifier for sensing data to be read from the corresponding memory cell; a hidden precharge control circuit for inhibiting the activation of a precharge signal at the end of a first memory access operation when successive memory access operations are to be performed with the first memory access operation at a first row address and a first memory block and the next memory access operation at the same first row address and a second memory block having a block address different from the first memory block.

Preferably, the hidden precharge control circuit inhibits the activation of precharge signal based on the presence of READ command and GAPLESS OPERATION CONTROL signal, and when the GAPLESS OPERATION CONTROL signal is at a valid logic state, a precharge operation is prohibited and a successive operation is performed, wherein the hidden precharge control circuit receives a bank address to be precharged.

The memory device further comprising a bank address generator, wherein the bank address generator includes a current bank select circuit and a next bank select circuit, wherein the current bank select circuit generates a BANK ADDRESS signal for a first gapless read operation and the next bank select circuit generates a BANK ADDRESS signal for a second gapless read operation, wherein the next bank select circuit receives a bank address in response to a READ command of the first gapless read operation and a GAPLESS CONTROL signal, wherein the hidden precharge control circuit receives a bank address to be precharged.

The memory device further comprising at least one bit bank address pin for accessing the memory banks, and the at least one bit bank address pin receives a second bank address for a second gapless read operation.

The memory device further comprising a block address generator for generating a block address in response to a READ command and a GAPLESS CONTROL signal for the first of successive read operations, wherein the block address generator receives a block address in response to an ACTIVE command.

According to another aspect of the invention, a semiconductor memory device is provided comprising a memory cell array having a plurality of memory blocks having respective block word lines and sharing a global word line, and a block address generator responsive to a GAPLESS OPERATION CONTROL signal having a first state for signaling a gapless successive read operation to generate a block address having the same global word line to activate each of the plurality of memory blocks according to the block address, wherein each of said memory blocks activated is accessible until a precharge command is issued.

The semiconductor memory device further comprising a precharge command generator responsive to the GAPLESS OPERATION CONTROL signal at a second state, and comprises a bank address generator, wherein the bank address generator includes a current bank select circuit for a first bank address of the gapless successive read operation and a next bank select circuit for a second bank address of the gapless successive read operation, wherein the next bank select circuit receives a bank address in response to a READ command of the first of the gapless successive read operation and the GAPLESS CONTROL signal having the first state

BRIEF DESCRIPTION OF THE DRAWINGS

The objects and advantages of the present invention will become more apparent by describing in detail preferred embodiments thereof with reference to the attached drawings in which:

FIG. 9 shows a memory cell access operation.

FIG. 11 shows two banks of the memory cell array and a memory cell access operation of the memory cell array according to the timing diagram of FIG. 10.

DETAILED DESCRIPTION OF PREFERRED EMBODIMENTS

Figure 1:
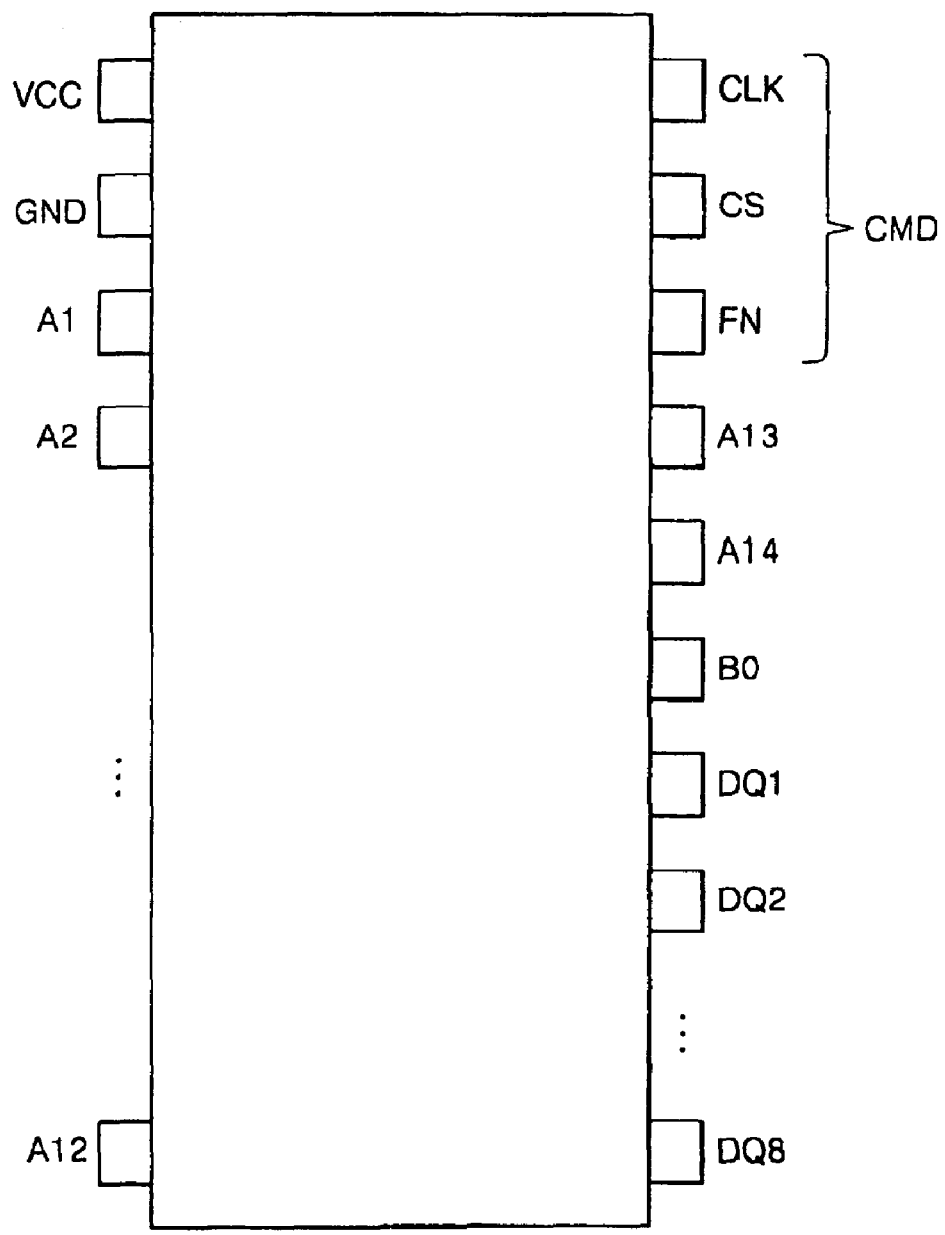
FIG. 1 shows a pin-out configuration for a 64 Mbit FCDRAM having segmented cell arrays.
Figure 2:
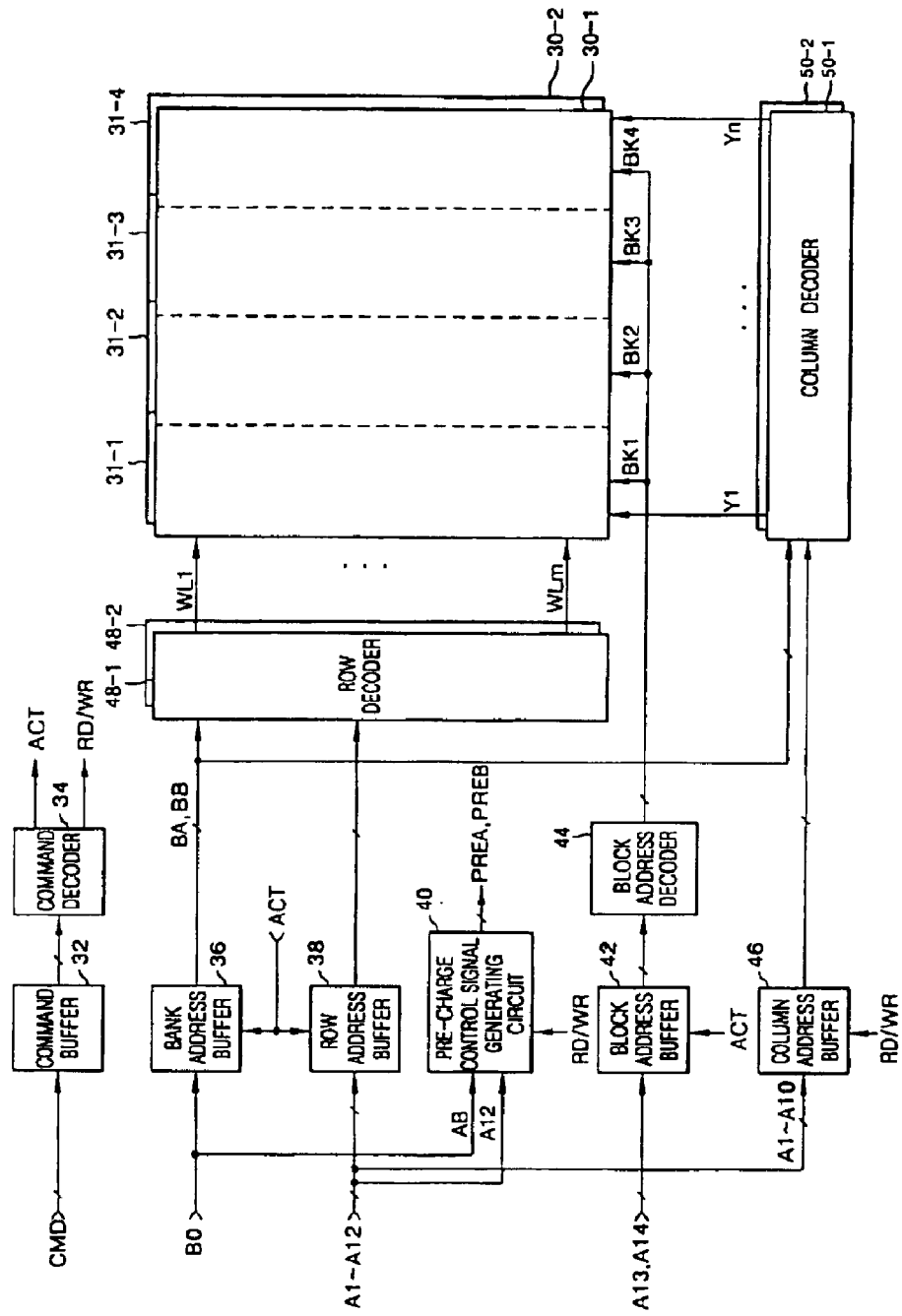
FIG. 2 shows a block diagram of a conventional fast cycle dynamic semiconductor memory device.
Figure 3:
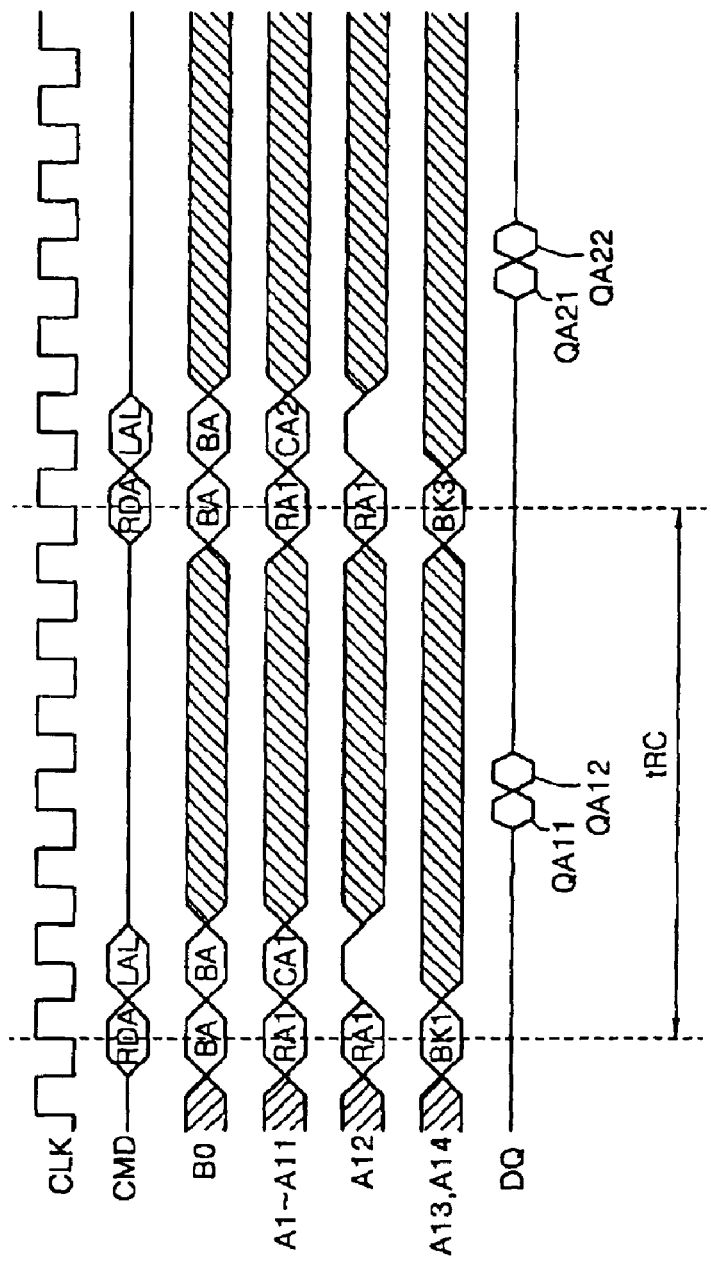
FIG. 3 shows a timing diagram illustrating a read operation of the semiconductor memory device of FIG. 2 when memory cells are accessed from the same memory cell array bank.
Figure 4:
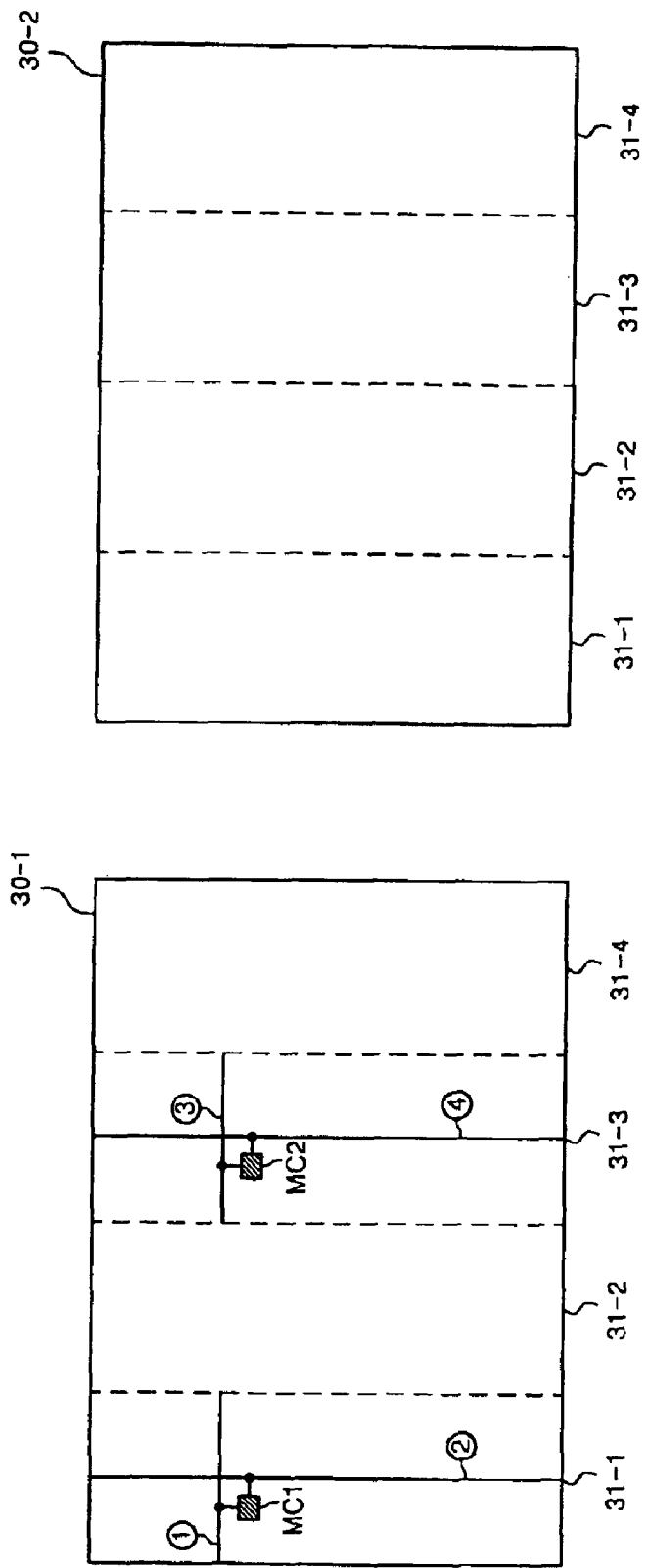
FIG. 4 shows a simplified block diagram version of the memory cell array according to the timing diagram of FIG. 3.

To fully understand the invention, the operational advantages thereof and the objects accomplished by the invention, preferred embodiments of the present invention will hereinafter be described with reference to the accompanying drawings. The same reference numerals in the respective drawings denote the same elements.

Figure 5:
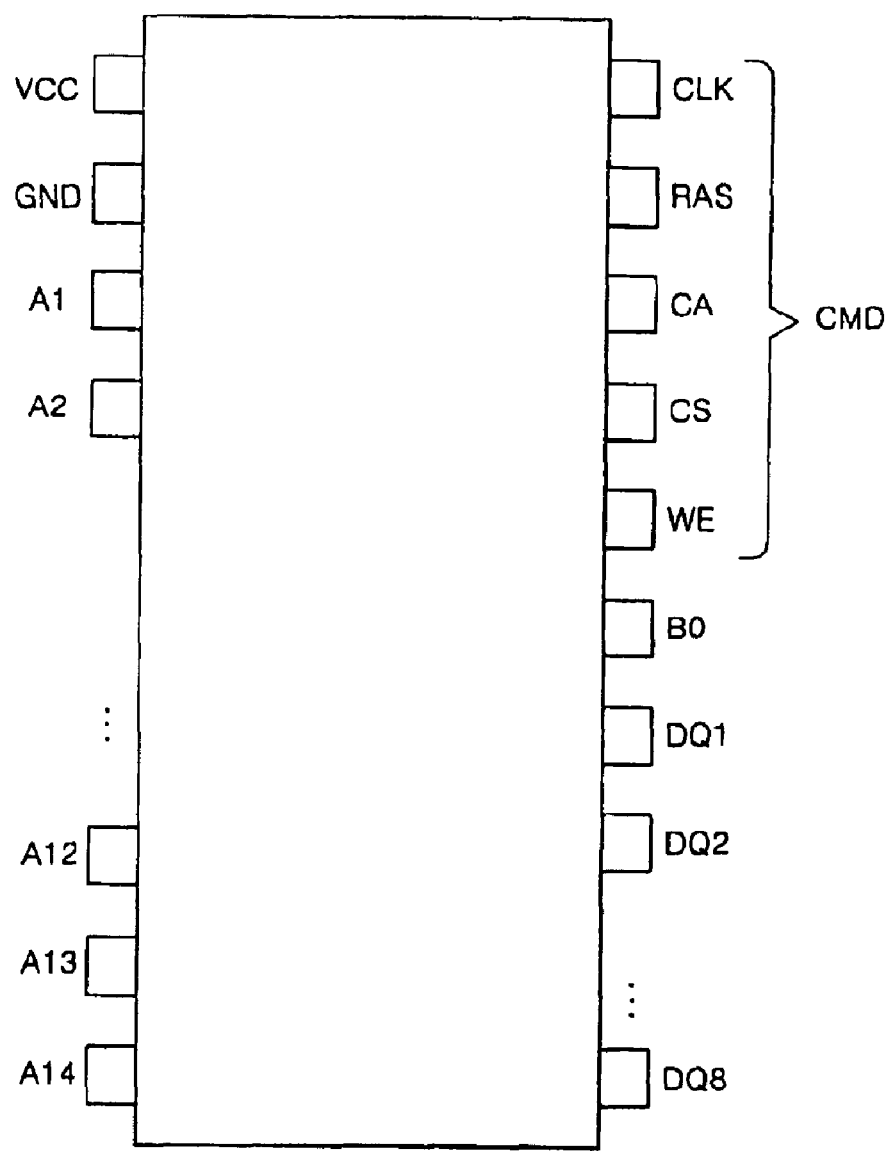
FIG. 5 shows a pin configuration of a semiconductor memory device according to an embodiment of the present invention.

FIG. 5 shows a pin configuration of a 64 M-bit semiconductor memory device having two memory cell array banks and eight data I/O pins DQ1 to DQ8.

The semiconductor memory device of FIG. 5 includes a power voltage pin VCC, a ground pin GND, address pins A1 to A12, block address pins A13 and A14, a bank address pin B0, data I/O pins DQ1 to DQ8, and command pins CMD (RAS, CAS, CS and WE pin). The command pins CMD can be used to apply a system clock signal CLK, a row address strobe signal RASB, an column address strobe signal CASB, an chip selecting signal CSB, and an write enable signal WEB.

An ACTIVE command is issued by the assertion at logic high of the RASB signal on the positive going edge of the system clock signal CLK to select an active row of the bank and the block to be used for an operation.

A READ command is used to access data from the active row selected by the ACTIVE command. The READ command is issued by asserting low on the CS pin and the CAS pin with WEB being high on the positive going edge of the system CLK.

The memory device internally generates a HIDDEN PRECHARGE command, which is issued by asserting high on the A12 pin during the READ command. The BANK ADDRESS signal for the hidden precharge operation is inputted on the A11 pin during the READ command. A gapless operation is performed by bringing a logic low on A12 pin in response to the READ command.

Table 1 shows signals applied to address pins in response to an ACTIVE command or READ command for a gapless read operation.

TABLE 1

| Address Pin Name | Command | | |
|---|---|---|---|
| | ACTIVE command | READ command | |
| | | Gapless operation mode | Gapless operation termination mode |
| B0 | | Current bank address signal | |
| A1~A10 | Row address RA1 to RA12 | Column address signals CA1 to CA10 | Column address signals CA1 to CA10 |
| A11 | | Bank address for a gapless operation | Bank address for a hidden pre-charge operation |
| A12 | | Gapless operation control signal having a first state (logic "low" level) | Gapless operation control signal having a second state (logic "high" level) |
| A13, A14 | Block address | Block address | |

As can be seen in Table 1, when the ACTIVE command of a first read operation is applied, the address pins A1 to A12 receive a ROW ADDRESS signal RA1 to RA12, the bank address pin B0 receives a BANK ADDRESS signal, and the address pins A13 and A14 receive a BLOCK ADDRESS signal.

When a READ command of the first operation is applied, the COLUMN ADDRESS signals and the BANK ADDRESS signal are applied to the address pins A1 to A10 and the bank address pin B0, respectively. The GAPLESS OPERATION CONTROL signal is applied which is used as a flag for signaling successive gapless memory access operation to the address pin A12. The ROW ADDRESS signal RA1 to RA10 and the COLUMN ADDRESS signal CA1 to CA10 are multiplexed on the same pins A1 to A10. The ROW ADDRESS signal RA12 and the GAPLESS OPERATION CONTROL signal are multiplexed on the same pin A12.

When an active GAPLESS OPERATION CONTROL signal of the first state (e.g. logic low) is asserted on the address pin A12, a BLOCK ADDRESS and a BANK ADDRESS of a succeeding second operation of the gapless operation are inputted via the address pins A13 and A14 and the address pin A11 in response to the READ command of the first operation of the gapless operation. The ROW ADDRESS signal RA11 of the first operation and the BANK ADDRESS of the second operation are multiplexed on the same pin A11.

On the other hand, when an inactive GAPLESS OPERATION CONTROL signal of the second state (e.g. logic high) is asserted on the address pin A12 at the READ command of the first operation, a hidden precharge operation is performed at the bank selected by the BANK ADDRESS inputted via the address pin A11, and other commands are inhibited at the bank selected by the BANK ADDRESS inputted via the address pin A11 during the hidden precharge operation.

Figure 6:
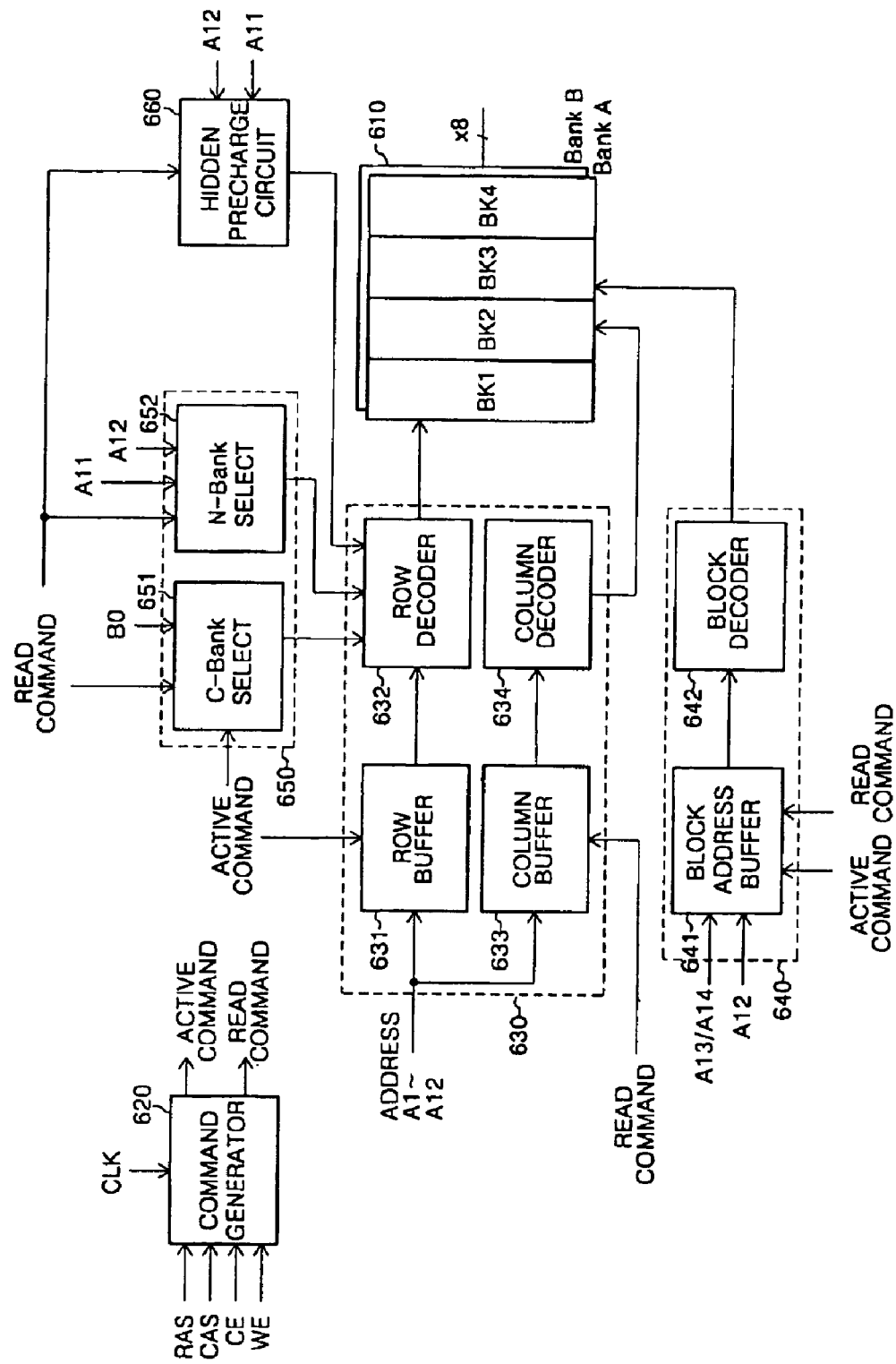
FIG. 6 is a block diagram of a memory device according to a preferred embodiment of the present invention.

FIG. 6 shows a memory device according to a preferred embodiment of the present invention. The semiconductor memory device includes a memory cell array 610, a command generator 620, an address generator 630, a block address generator 640, a bank address generator 650 and a hidden precharge circuit 660.

The memory cell array 610 is organized into two banks, BANK A and Bank B, and each bank is segmented into four blocks BK1, BK2, BK3 and BK4.

The command generator 620 generates an ACTIVE command, a READ command in response to the combination of a system clock signal CLK, a row address strobe signal RASB, a column address strobe signal CASB and a chip select signal CSB.

The address generator 630 includes a row buffer 631 and a row decoder 632 and selects a global word line in response to the ACTIVE command of a first operation. A column address buffer 633 and a column decoder 634 selects a column address in response to the READ command of the first operation.

The bank address generator 650 includes a current bank-select circuit 651 and next bank-select circuit 652. The current bank-select circuit 651 generates a BANK ADDRESS for the first operation in response to an ACTIVE command and a READ command. The next bank select circuit 652 receives a BANK ADDRESS signal from A11 and selects a bank for the second operation of the gapless operation in response to the READ command of the first operation and the GAPLESS OPERATION CONTROL signal having a first state asserted on pin A12.

The block address generator 640 includes a block address buffer 641 and a block address decoder 642. The block address buffer 641 receives a BLOCK ADDRESS signal A13 and A14 in response to the ACTIVE command and the READ command.

By asserting a logic low on pin A12 along with the READ command, which is the GAPLESS OPERATION CONTROL signal having a first state in Table 1, the block address buffer 641 receives a BLOCK ADDRESS signal through A13 to A14 pins and the block address decoder 642 selects a block for the second operation according to the BLOCK ADDRESS in response to the READ command of the first operation.

The hidden precharge circuit 660 issues a HIDDEN PRECHARGE command to the bank selected by BANK ADDRESS signal inputted to the A11 pin in response to the READ command of the first operation. The HIDDEN PRECHARGE command is preferably generated by circuiting used for generating an AUTO PRECHARGE command known to one ordinary skilled in the art.

Figure 7:
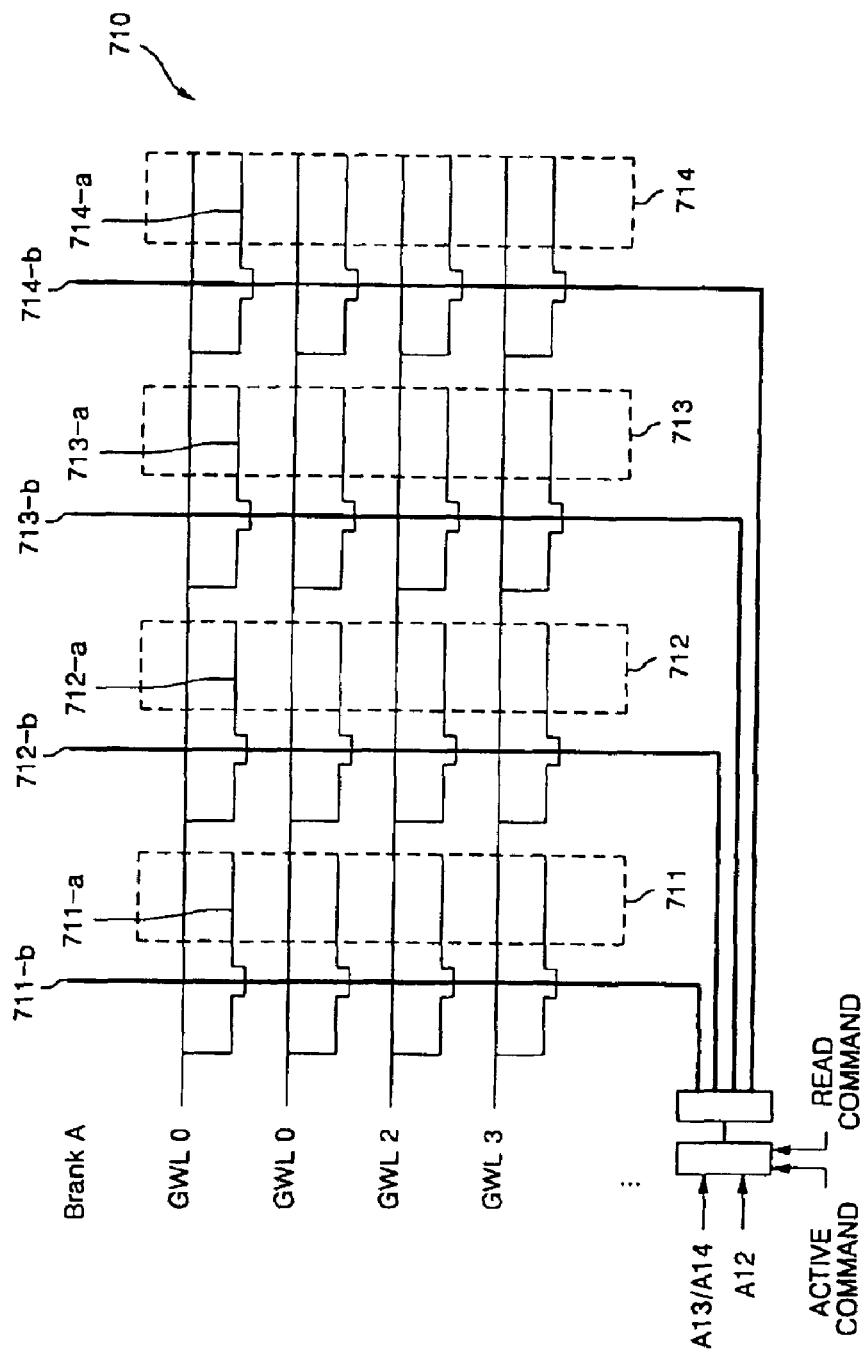
FIG. 7 shows the use of the block address generator in FIG. 6 with a memory bank.

FIG. 7 shows how the first block address and the second block address are used for accessing a cell array. For illustration, a plurality of global word lines (GWL0 to GWLN-1) are shown to run across the memory cell array 710 in the row direction. Each of the global word lines has four block word lines which run across the block cell array in the same row direction. A switching transistor is located between and connected to each of the global word lines (GWL0 to GWLN-1) and each of the block word lines (711-a to 714-a). A block word line in a block cell array is activated by an ACTIVE command along with BANK ADDRESS signal, ROW ADDRESS signals RA1 to RA12 and BLOCK ADDRESS signal. During the gapless operation, another block word line having the same BANK ADDRESS signal and ROW ADDRESS signal can be activated according to BLOCK ADDRESS signal in response to READ command.

Figure 8:
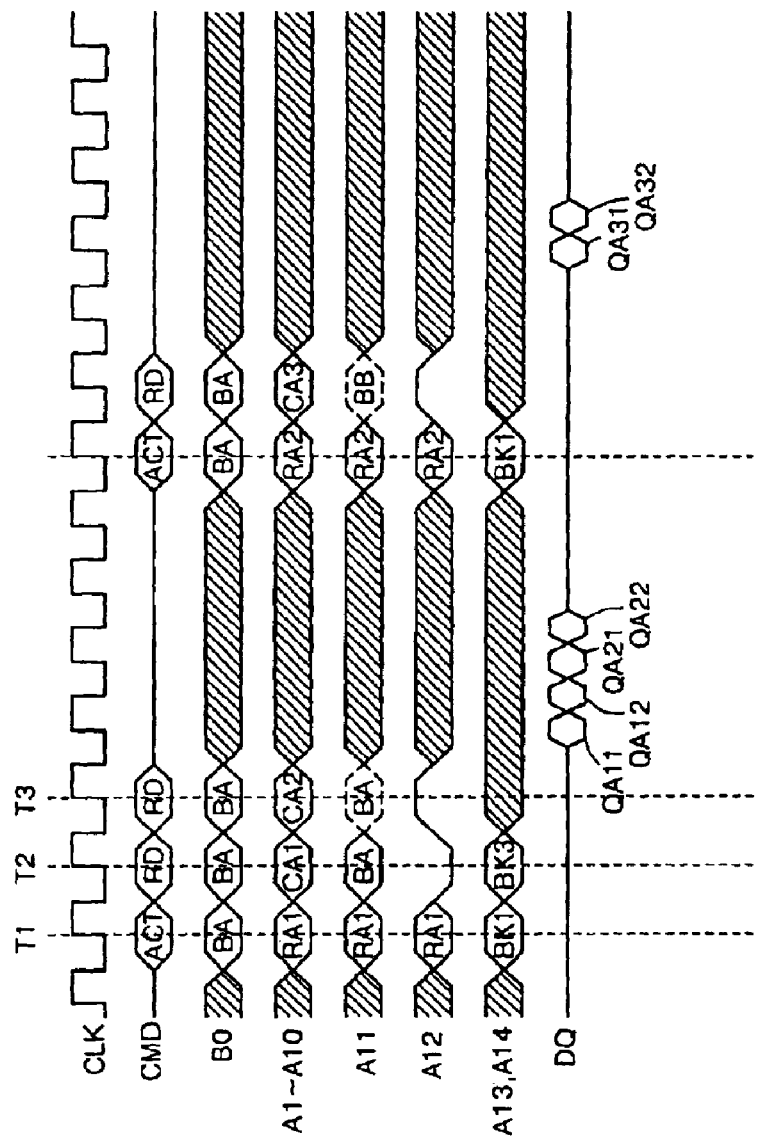
FIG. 8 is a timing diagram illustrating a read operation of the semiconductor memory device according to an embodiment of the present invention.

FIG. 8 is a timing diagram illustrating a gapless read operation with a first and second read operation of the semiconductor memory device according to an embodiment of the present invention. For illustration, FIG. 8 shows the semiconductor memory device operating with a burst length of "2", and a column address strobe (CAS) latency of "2". One skilled in the art readily appreciates that the present invention can be applicable to other burst lengths, such as four or eight, etc.

FIG. 9 shows a memory cell access operation in the gapless operation. Referring to FIGS. 8 and 9, at T1 of ACTIVE command, the memory device receives BANK ADDRESS signal BA from pin B0, ROW ADDRESS signal RA1, and BLOCK ADDRESS signal BK1 at a rising edge of the clock signal CLK. The block word line ① of the memory cell array block BK1 of the memory cell array bank BA is activated so that each memory cell belonging to the block word line is temporally stored by each corresponding sense amplifier (not shown). After time tRCD is passed at T2, the memory device receives the READ command of the first read operation with the BANK ADDRESS signal BA and the COLUMN ADDRESS signal CA1. The memory device also receives a BANK ADDRESS signal BA from pin A11, the BLOCK ADDRESS signal BK3 from pins A13 to A14, and the GAPLESS OPERATION CONTROL signal having a first state (for example, logic "low") from pin A12 for the second operation in advance along with a READ command of the first operation.

The bit line ② of the memory cell array block BK1 of the memory cell array bank BA is selected so that the stored data in each corresponding sense amp is read out to DQ. At the same time, the block word line ③ of the memory cell array block BK3 of the memory cell array bank BA is selected in response to the GAPLESS OPERATION CONTROL signal having a first state.

At T3, the memory device receives the READ command of the second operation with BANK ADDRESS signal BA and the COLUMN ADDRESS signal CA2 at a rising edge of the clock signal CLK. The COLUMN ADDRESS signal and the BLOCK ADDRESS signal are invalid because the GAPLESS OPERATION CONTROL signal having a second state (logic high) is asserted on the pin A12. Instead, the BANK ADDRESS signal inputted to pin A11 indicates the bank A to be precharged when the GAPLESS OPERATION CONTROL signal having a second state is ascertained on the pin A12.

The bit line ④ of the memory cell array block BK3 of the memory cell array bank BA is selected so that the stored data in the corresponding sense amp is read out to DQ. At this time, the memory device receives the HIDDEN PRE-CHARGE command.

Thus, four output data of each of the four output data groups QA11 to QA14 (block 1), ..., QA41 to QA44 (block 4) are sequentially outputted without time gap between them in response to the respective READ command in two cycles after the READ command is applied.

Figure 10:
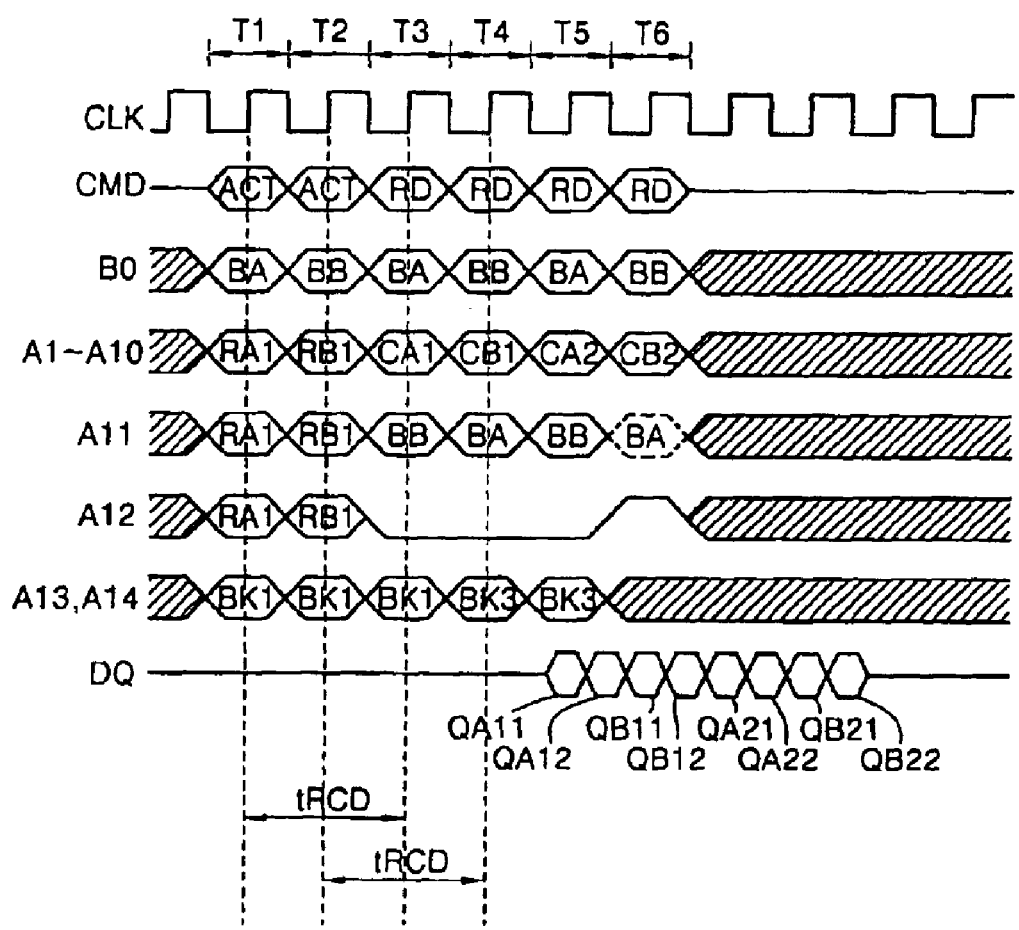
FIG. 10 is a timing diagram illustrating a read operation of the semiconductor memory device when a data is read in bank interleave mode according to the present invention.

FIG. 10 is a timing diagram illustrating a gapless read operation of the semiconductor memory device when a data is read in bank interleave mode. FIG. 11 shows bank A and bank B of the memory cell array to describe a memory cell access operation of the memory cell array according to the timing diagram of FIG. 10.

In FIG. 10, the odd number timing (T1, T3, T5) is a gapless operation with a first and third operation for bank A and the even number timing (T2, T4 and T6) is a gapless operation with a second and fourth operation for bank B.

Referring to FIGS. 10 and 11, at T1 and T2, the memory device receives the ACTIVE command of the first read operation and the third read operation for bank A and bank B, respectively. The block word lines of ① and ② are activated so that each cell belonging to the block word line is temporally stored by each corresponding sense amplifier.

At T3 after time tRCD is passed from T1, the memory device receives the READ command of the first operation with the bank address BA from pin B0 and the column address CA1 from A1~A10. The memory device also receives the bank address BB from pin A11, the block address BK1 of bank B from pins A13~A14, and gapless operation control signal having a first state from pin A12 for the third operation in advance along with READ command of the first operation. So, the bit line ③ of the memory cell array block BK1 of the memory cell array bank BA is selected so that the stored data in each sense amplifier (not shown) is read out to DQ. At the same time, the block word line ② of the memory cell array block BK1 of the memory cell array bank BB is selected in response to the gapless operation control signal having a first state asserted at the A12 pin.

At T4 after time tRCD is passed from T2, the memory device receives the READ command of the second operation with the BANK ADDRESS signal BB from pin B0 and the COLUMN ADDRESS signal CB1 from pin A1 to A10. It also receives the BANK ADDRESS signal BA, the BLOCK ADDRESS signal BK3 of bank A, and GAPLESS OPERATION CONTROL signal having a first state from pin A12 for the fourth operation in advance along with READ COMMAND of the second operation.

The bit line ④ of the memory cell array block BK1 of the memory cell array bank B is selected so that the stored data in each corresponding sense amplifier is read out to DQ. At the same time, the block word line ⑤ of the memory cell array block BK3 of the memory cell array bank A is selected in response to the gapless operation control signal having a first state ascertained to the A12 pin.

At T5, the memory device receives the READ command of the third operation with the BANK ADDRESS signal BA from pin B0 and the COLUMN ADDRESS signal CA2 from pin A1 to A10. It also receives the BANK ADDRESS signal BB from pin A11, the BLOCK ADDRESS signal BK3 of bank B, and GAPLESS OPERATION CONTROL signal having a first state from pin A12 for the fourth operation in advance along with READ command of the third operation.

The bit line ⑥ of the memory cell array block BK3 of the memory cell array bank A is selected so that the stored data in each corresponding sense amp is read out to DQ. At the same time, the block word line ⑦ of the memory cell array block BK3 of the memory cell array bank B is selected in response to the gapless operation control signal having a first state ascertained to the A12 pin.

At T6 of the READ command of the fourth operation, the memory device receives BANK ADDRESS signal BB and the COLUMN ADDRESS signal CB2 at a rising edge of the clock signal CLK. The BANK ADDRESS signal BA from pin A11 indicates the bank A to be precharged when GAPLESS OPERATION CONTROL signal having a second state from the pin A12.

The bit line ⑧ of the memory cell array block BK3 of the memory cell array bank BB is selected so that the stored data in each corresponding sense amp is read out to DQ. At this time, the memory device receives the HIDDEN PRE-CHARGE command for bank BA with the read command. Thus, the gapless operation of the first and third read operation is finished.

As described herein before, when the read operation or the write operation for the same global word line is performed, the block word line of the next operated memory cell array block as well as the bit line of the currently operated memory cell array block is selected together, thereby reducing memory access time. In addition, a memory device does a hidden precharge operation for a bank different from a current activated bank at the same read command so that the memory device can reduce the time for a memory bank change for a precharge in interleave mode.

Accordingly, interleave read operation with hidden precharge is performed according to the present invention in a highly efficient and gapless manner.

It is appreciated by one skilled in the art that the illustrative memory cell access method described above can be applied to the write operation as well.

Embodiments according to the present invention have been explained in the drawings and specification, and though specific terminologies are used here, those were only to explain the present invention. Therefore, the present invention is not restricted to the above-described embodiments and many variations are possible within the spirit and scope of the present invention. The scope of the present invention is not determined by the description but by the accompanying claims.

What is claimed is:

1. In a semiconductor memory device having a plurality of memory cells grouped in memory banks, each memory bank having a plurality of memory blocks accessible by a common row address, a method of reading from or writing to the plurality of memory blocks, comprising the steps of:
   detecting successive read operations of different blocks;
   prefetching the address of the next block to be read or written during the first of the successive read operations; and
   withholding a precharge of the memory bank having the successively read or written memory blocks after the first of the successive read or write operations until completion of the successive read or write operations.

2. The method of claim 1, further including the step of generating a valid flag upon detecting a successive read or write operation.

3. The method of claim 2, further including the step of withholding a precharge command upon receipt of the valid flag.

4. The method of claim 2, wherein the valid flag signal is input to the memory device via an address pin.

5. The method of claim 2, wherein a next bank signal for signaling the next bank to be read or written is input to the memory device via an address pin.

6. The method of claim 1, further including the step of prefetching a next bank signal for signaling the next bank to be read or written during the first of the successive read or write operations.

7. The method of claim 2, further including issuing a precharge command when the valid flag is off.

8. The method of claim 1, wherein the memory device is a DRAM.

9. The method of claim 1, wherein the successive read or write operations are completed after the issuance of one active bank command.

10. The method of claim 1, further including the step of interleaving between more than one memory banks.

11. The method of claim 1, further including the step of issuing a precharge command upon completion of the successive read or write operations.

12. The method of claim 11, wherein the precharge command is one of an externally issued and a HIDDEN PRECHARGE command.

13. A semiconductor memory device comprising:
  a plurality of memory blocks sharing a global word line and having respective block word lines connected to the global word line;
  a bit line and a sense amplifier corresponding to each memory cell in each memory block, each sense amplifier for sensing data to be read from the corresponding memory cell;
  a hidden precharge control circuit for deactivating the global word line responsive to a bank address according to a logic state of a gapless operation signal.

14. The memory device of claim 13, wherein the hidden precharge control circuit inhibits the activation of precharge signal based on the presence of READ command and gapless operation signal.

15. The memory device of claim 14 wherein when the gapless operation signal is at a valid logic state, a precharge operation is prohibited and a successive operation is performed.

16. The memory device of claim 13, wherein the hidden precharge control circuit receives a bank address to be precharged.

17. The memory device of claim 13 further comprising a bank address generator, wherein the bank address generator includes a current bank select circuit and a next bank select circuit, wherein the current bank select circuit generates a BANK ADDRESS signal for a first gapless read operation and the next bank select circuit generates a BANK ADDRESS signal for a second gapless read operation.

18. The memory device of claim 17, wherein the next bank select circuit receives a bank address in response to a READ command of the first gapless read operation and a gapless operation signal.

19. The memory device of claim 17, wherein the hidden precharge control circuit receives a bank address to be precharged.

20. The memory device of claim 13, further comprising at least one bit bank address pin for accessing the memory banks.

21. The memory device of claim 20, wherein the at least one bit bank address pin receives a second bank address for a second gapless read operation.

22. The memory device of claim 13, further comprising a block address generator for generating a block address in response to a READ command and a gapless operation signal for the first of successive read operations.

23. The memory device of claim 22, wherein the block address generator receives a block address in response to an ACTIVE command.

24. A semiconductor memory device comprising:
  a memory cell array having a plurality of memory blocks having respective block word lines and sharing a global word line; and
  a block address generator responsive to a GAPLESS OPERATION signal having a first state for signaling a gapless successive read operation to generate a block address having the same global word line to activate each of the plurality of memory blocks according to the block address, wherein each of said memory blocks activated is accessible until a precharge command is issued.

25. The semiconductor memory device of claim 24 further comprising a precharge command generator responsive to the GAPLESS OPERATION signal at a second state.

26. The semiconductor memory device of claim 24 further comprises a bank address generator, wherein the bank address generator includes a current bank select circuit for a first bank address of the gapless successive read operation and a next bank select circuit for a second bank address of the gapless successive read operation.

27. The semiconductor memory device of claim 26, wherein the next bank select circuit receives a bank address in response to a READ command of the first of the gapless successive read operation and the GAPLESS OPERATION signal having the first state.

* * * * *